(12) United States Patent
Khatibi et al.

(10) Patent No.: US 8,502,597 B2
(45) Date of Patent: Aug. 6, 2013

(54) LOW-PASS FILTER DESIGN

(75) Inventors: Arezou Khatibi, San Jose, CA (US); Ara Bicakci, San Jose, CA (US); Rainer Gaethke, San Francisco, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 453 days.

(21) Appl. No.: 12/603,448

(22) Filed: Oct. 21, 2009

(65) Prior Publication Data
US 2011/0090824 A1    Apr. 21, 2011

(51) Int. Cl.
*H03K 5/00*    (2006.01)
(52) U.S. Cl.
USPC ............................. 327/558; 327/552
(58) Field of Classification Search
USPC ................... 327/336–337, 551–559
See application file for complete search history.

(56) References Cited

U.S. PATENT DOCUMENTS

| | | | |
|---|---|---|---|
| 6,112,125 A | 8/2000 | Sandusky | |
| 7,218,170 B1 * | 5/2007 | Carter et al. | 327/552 |
| 7,298,221 B2 * | 11/2007 | Yan | 331/17 |
| 7,839,217 B2 * | 11/2010 | Okuma | 330/296 |
| 7,868,688 B2 * | 1/2011 | Easwaran et al. | 327/558 |
| 7,902,917 B2 * | 3/2011 | Mirzaei et al. | 327/558 |
| 2007/0057732 A1 | 3/2007 | Chang et al. | |
| 2010/0066442 A1 * | 3/2010 | Mu | 327/553 |

FOREIGN PATENT DOCUMENTS
WO    WO9804038 A1    1/1998

OTHER PUBLICATIONS

International Search Report and Written Opinion—PCT/US2010/053626, International Search Authority—European Patent Office—Mar. 18, 2011.

\* cited by examiner

*Primary Examiner* — Dinh T. Le
(74) *Attorney, Agent, or Firm* — Ramin Mobarhan

(57) ABSTRACT

Techniques for low-pass filtering with high quality factor (Q). In an exemplary embodiment, an input current is coupled to the drain of a first transistor. The drain and the gate of the first transistor are coupled together by a resistor R1, and the drain is coupled to a reference voltage by a first capacitor C1. The gate is coupled to a reference voltage by a second capacitor C2. The gate is further coupled to the gate of a second transistor, and an output current is coupled to the drain of the second transistor. In another exemplary embodiment, further passive elements may be coupled to generate an odd-order low-pass transfer characteristic. Multiple filters may be cascaded in series to synthesize a filter having arbitrary order.

21 Claims, 19 Drawing Sheets

LOW-PASS FILTER DESIGN

BACKGROUND

1. Field

The disclosure relates to filter design, and in particular, to the design of current-mode low-pass filters.

2. Background

In the art of filter design, a current-mode filter may be used to filter a signal in the current domain. Such current-mode filters are advantageously employed in applications wherein, e.g., a preceding and/or subsequent circuit block processes signal currents, as opposed to signal voltages. For example, in a communications transmitter application, the output of a digital-to-analog converter (DAC) and the input to an up-conversion mixer are both commonly designed to process signal currents, and thus a current-mode filter may be readily employed between the DAC and the mixer to, e.g., low-pass filter the DAC output current prior to providing to the mixer input.

Certain prior art current-mode filters employ a current mirror topology, wherein one or more resistor-capacitor (RC) networks are coupled between the gates of the current mirror transistors to provide low-pass filtering. While being conceptually simple to design and implement, such prior art designs exhibit certain disadvantages, in particular, a generally low quality factor (Q) that is limited to at most ½. It will be appreciated that filters for, e.g., communications transceivers, will in general require higher Q's to achieve a desired attenuation at a given frequency while minimizing in-band attenuation.

It would be desirable to provide novel techniques for designing a current-mode filter with arbitrarily high Q, and furthermore having a natural frequency that may be arbitrarily selected.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein.

Figure 1:
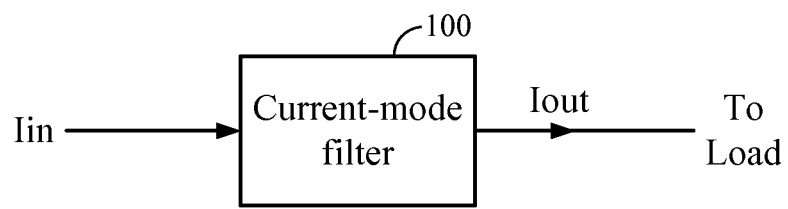
FIG. 1 illustrates an exemplary embodiment of a current-mode filter according to the present disclosure.

FIG. 1 illustrates an exemplary embodiment of a current-mode filter 100 according to the present disclosure. In FIG. 1, the current-mode filter 100 accepts an input current Iin and generates a filtered output current Iout. The output current Iout may be supplied to a load (not shown). The filter 100 may perform, e.g., low-pass filtering of the input current Iin to generate the output current Iout. The filter 100 may be preferable to, e.g., a voltage-mode filter (not shown) in applications wherein the stage preceding the filter 100 generates a current as output, and/or the stage following the filter 100 accepts a current as input.

It will be appreciated that while the current-mode filter 100 is shown as accepting an input current and generating an output current, a filter based on the current-mode filter 100 may readily be designed to process other types of signals, e.g., an input voltage and/or an output voltage. For example, voltage-to-current conversion may be performed to convert an input voltage to an input current, while current-to-voltage conversion may be performed to convert the output current of the current-mode filter to an output voltage. Such alternative exemplary embodiments are contemplated to be within the scope of the present disclosure.

Figure 2:
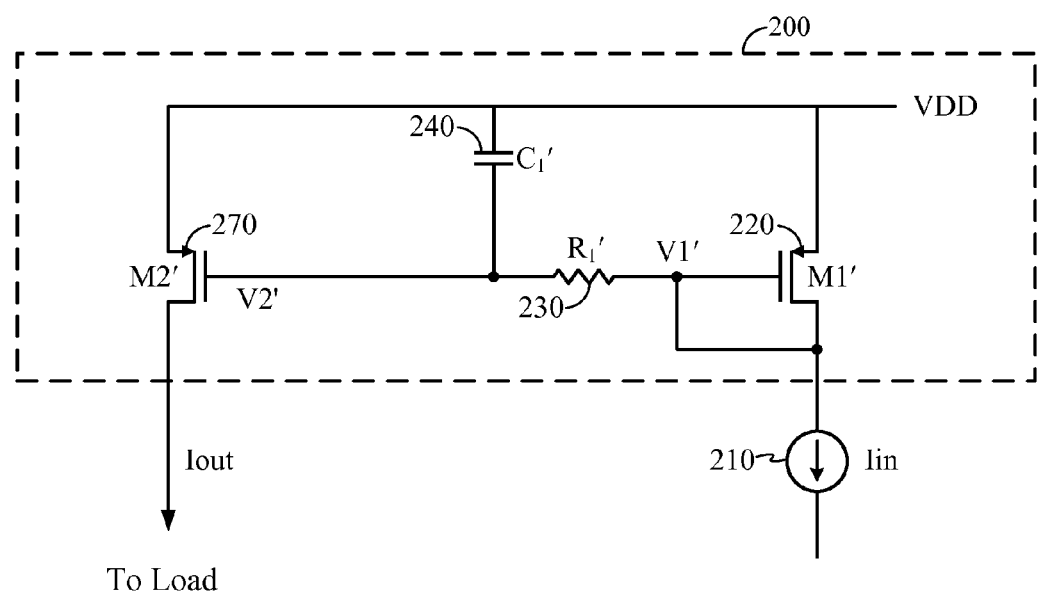
FIG. 2 illustrates a prior art implementation of a current-mode filter.

FIG. 2 illustrates a prior art implementation 200 of a current-mode filter 100. In FIG. 2, the drain of a diode-coupled first transistor 220 (or M1') is coupled to the input current Iin. The input current Iin induces a voltage V1' at the gate of M1' via the current-to-voltage conversion characteristics of M1'. The voltage V1' is coupled via a resistor 230 (or $R_1'$) to the gate voltage V2' of a second transistor 270 (or M2'). A capacitor 240 (or $C_1'$) is also provided to couple the gate of M2' to the source voltage VDD. It will be appreciated that $R_1'$ and $C_1'$ effectively form a first-order low-pass filter from V1' to V2'. The voltage V2' generates an output current Iout at the drain of M2', which is subsequently provided to a load (not shown).

Figure 2A:
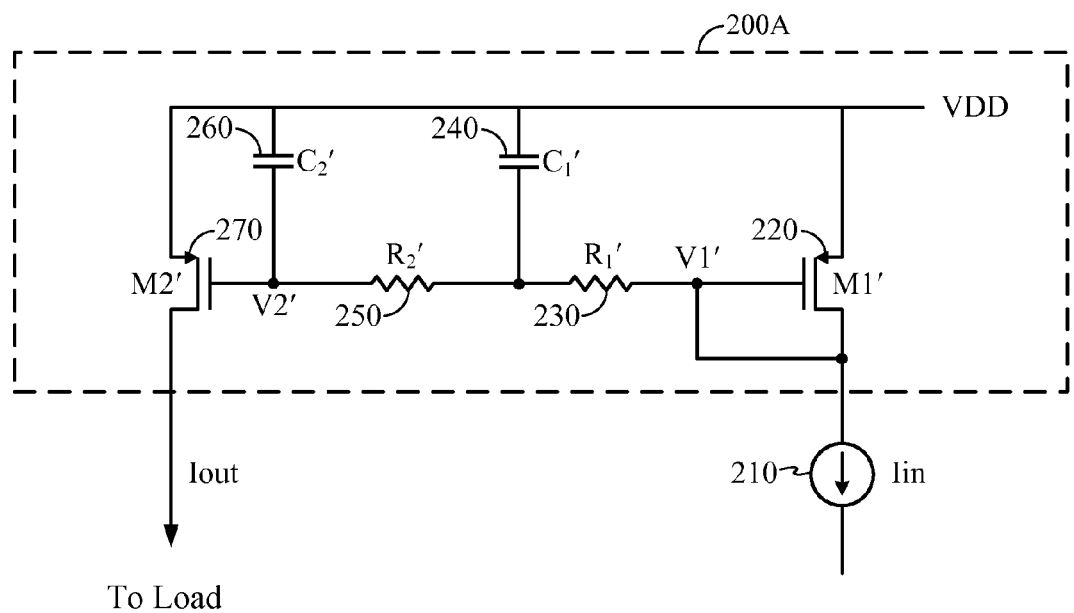
FIG. 2A illustrates another prior art implementation of a current-mode filter.

FIG. 2A illustrates another prior art implementation 200A of a current-mode filter 100. In FIG. 2A, a resistor 250 (or $R_2'$) is further provided between the gates of M1' and M2', and a capacitor 260 (or $C_2'$) is coupled from the gate of M2' to VDD. It will be appreciated that the combination of $R_1'$, $R_2'$, $C_1'$, and $C_2'$ effectively forms a second-order low-pass filter from V1' to V2'.

One of ordinary skill in the art will appreciate that a shortcoming of prior art filters such as 200 and 200A is that the Q of the transfer function Iout/Iin for such filters is limited to at most ½. For many applications, e.g., in communications transceivers, it would be desirable to have filters with higher Q to maximize out-of-band signal attenuation while minimizing in-band signal degradation.

Figure 3:
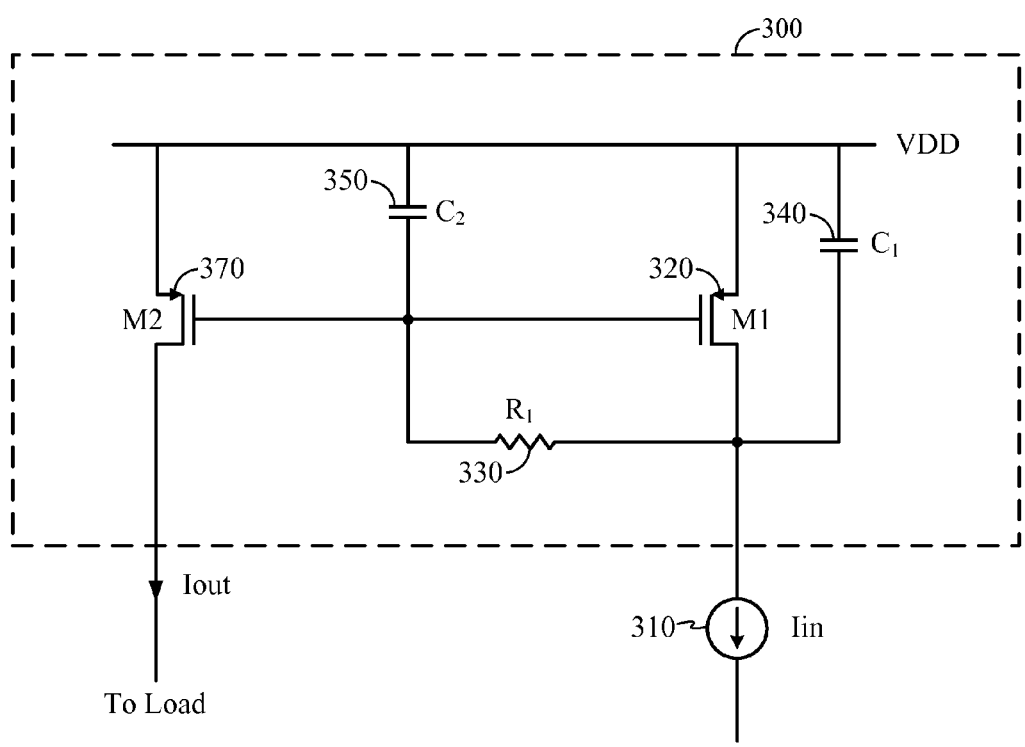
FIG. 3 illustrates an exemplary embodiment of a filter according to the present disclosure.

FIG. 3 illustrates an exemplary embodiment 300 of a filter 100 according to the present disclosure. Note the filter 300 in FIG. 3 is shown for illustrative purposes only, and is not meant to limit the scope of the present disclosure.

In FIG. 3, the drain of a first transistor 320 (or M1) is coupled to the input current Iin 310. The drain of M1 is further coupled via a resistor $R_1$ 330 to its gate, and via a capacitor 340 (or $C_1$) to a reference voltage, e.g., a source voltage VDD. The gate of M1 is coupled to the source voltage VDD via a capacitor 350 (or $C_2$). The gate of M1 is also coupled to the gate of a second transistor 370 (or M2). M2 generates a current Iout at its drain in response to its gate voltage, and the drain current is subsequently provided as the output current to a load (not shown).

It will be appreciated that the characteristics of the filter 300 may be expressed as follows:

$$H(s) = \frac{I_{out}}{I_{in}} = \frac{\frac{g_{m2}}{R_1 C_1 C_2}}{s^2 + \frac{(C_1+C_2)}{R_1 C_1 C_2}s + \frac{g_{m1}}{R_1 C_1 C_2}}; \quad \text{(Eq. 1)}$$

$$\omega_n^2 = \frac{g_{m1}}{R_1 C_1 C_2}; \text{ and} \quad \text{(Eq. 2)}$$

$$Q = \sqrt{\frac{g_{m1} R_1 C_1 C_2}{(C_1+C_2)^2}}; \quad \text{(Eq. 3)}$$

wherein $g_{m1}$ and $g_{m2}$ represent the transconductances of M1 and M2, respectively, H(s) represents the transfer function from Iin to Iout, $\omega_n^2$ represents the square of the cut-off (or natural) frequency of the transfer function H(s), and Q represents the quality factor. It will be appreciated from Eq. 1 that the filter 300 has a second-order low-pass filter transfer characteristic, and that Q and $\omega_n$ may be set to arbitrary values by appropriate choice of the variables shown.

Figure 3A:
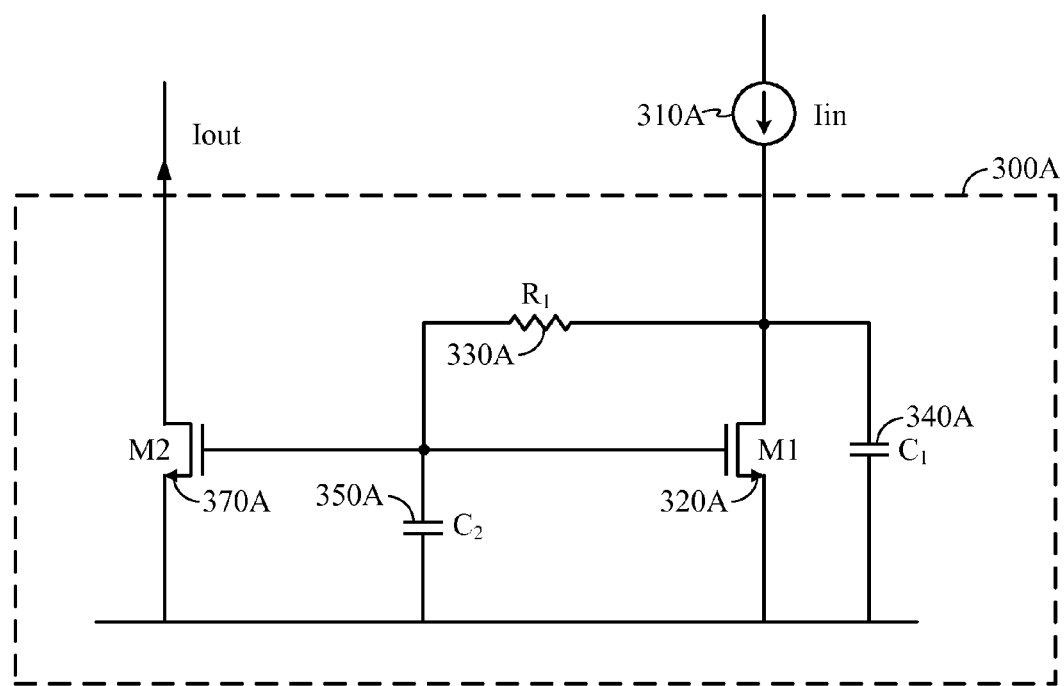
FIG. 3A illustrates an alternative exemplary embodiment 300A of a filter 100 according to the present disclosure.

FIG. 3A illustrates an alternative exemplary embodiment 300A of a filter 100 according to the present disclosure. It will be appreciated that the filter 300A may be identical in structure to the filter 300 shown in FIG. 3A, with NMOS transistors 320A and 370A used in place of PMOS transistors 320 and 370 in FIG. 3, and corresponding connections made to a ground voltage as the reference voltage rather than a positive supply voltage VDD as shown in FIG. 3.

In an exemplary embodiment, component values of the filter 300 or 300A may be chosen as follows: $g_{m1}$=1.54 mS, $R_1$=1.3 kOhms, $C_1$=20 pF, and $C_2$=15 pF, to design a filter having $\omega_n$=10 MHz and Q=0.7. In another exemplary embodiment, component values may be chosen as follows: $g_{m1}$=4.4 mS, $R_1$=3.713 kOhms, $C_1$=20 pF, and $C_2$=15 pF, to design a filter having $\omega_n$=10 MHz and Q=2.

Figure 4:
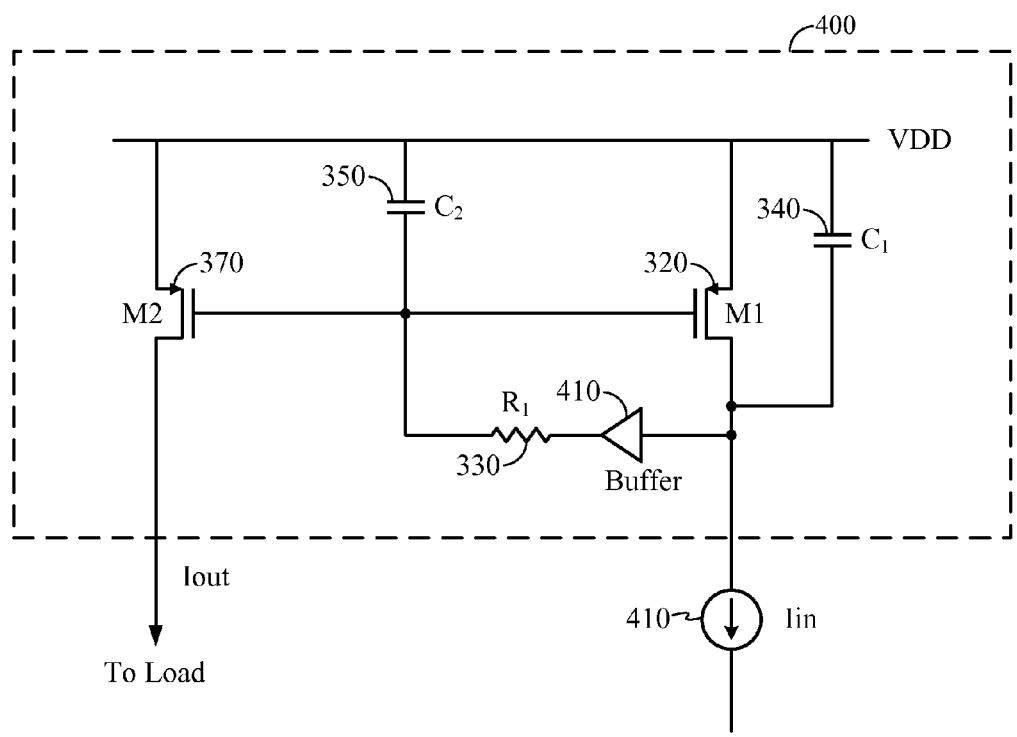
FIG. 4 illustrates an alternative exemplary embodiment of a filter according to the present disclosure.

FIG. 4 illustrates an alternative exemplary embodiment 400 of a filter 100 according to the present disclosure. Note elements in FIG. 4 labeled similarly to elements in FIG. 3 may have similar functions, unless otherwise noted. In FIG. 4, a voltage buffer 410 is provided between the drain of M1 and resistor $R_1$. The voltage buffer 410 is designed to sample the drain voltage of M1 (while ideally drawing no current from the drain of M1), and output a voltage tracking the sampled drain voltage.

It will be appreciated that the characteristics of the filter 400 may be expressed as follows:

$$H(s) = \frac{I_{out}}{I_{in}} = \frac{\frac{g_{m2}}{R_1 C_1 C_2}}{s^2 + \frac{1}{R_1 C_2}s + \frac{g_{m1}}{R_1 C_1 C_2}}; \quad \text{(Eq. 4)}$$

$$\omega_n^2 = \frac{g_{m1}}{R_1 C_1 C_2}; \text{ and} \quad \text{(Eq. 5)}$$

$$Q = \sqrt{\frac{g_{m1} R_1 C_2}{C_1}}; \quad \text{(Eq. 6)}$$

wherein $g_{m1}$ and $g_{m2}$ represent the transconductances of M1 and M2, respectively It will be appreciated that providing the voltage buffer 410 may allow the filter 400 to achieve higher Q than the filter 300, and/or help improve the linearity of the filter 400.

In an exemplary embodiment, component values of the filter 400 may be chosen as follows: $g_{m1}$=880 µS, $R_1$=743 Ohms, $C_1$=20 pF, and $C_2$=15 pF, to design a filter having $\omega_n$=10 MHz and Q=0.7. In another exemplary embodiment, component values may be chosen as follows: $g_{m1}$=2.5 mS, $R_1$=2.122 kOhms, $C_1$=20 pF, and $C_2$=15 pF, to design a filter having $\omega_n$=10 MHz and Q=2.

Figure 4A:
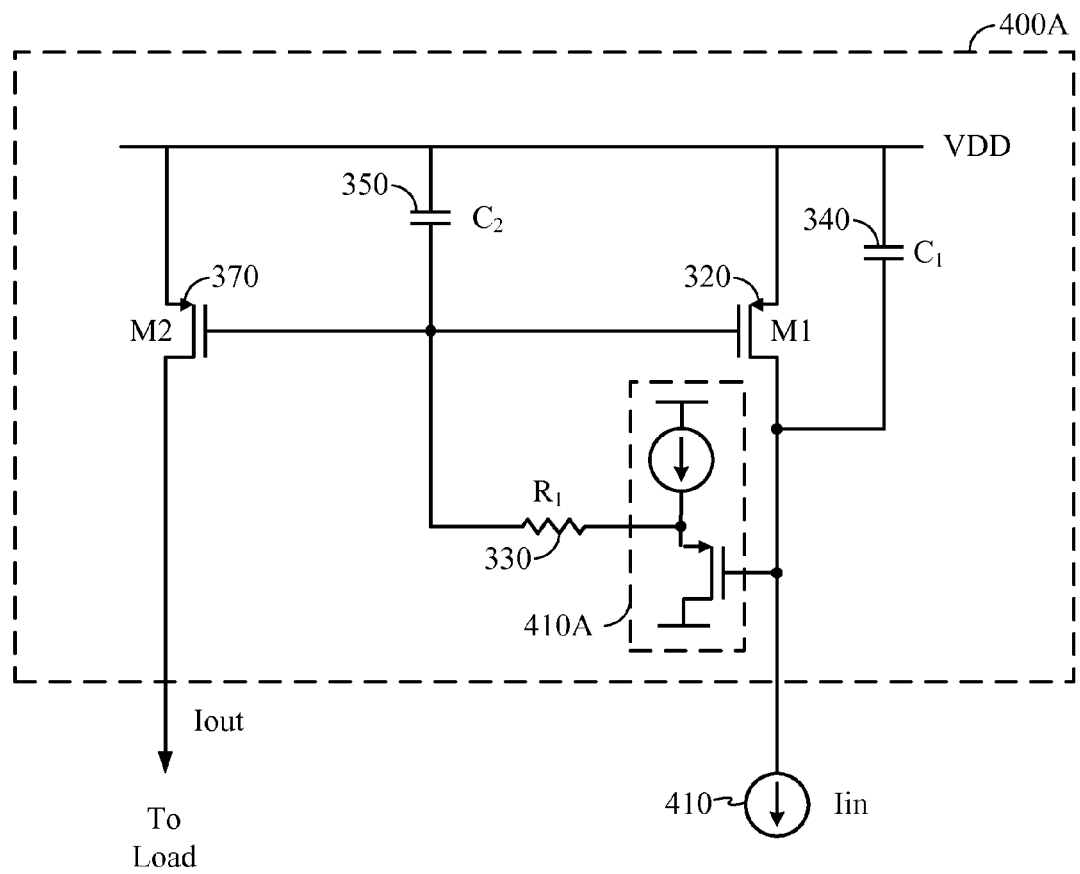
FIG. 4A illustrates an exemplary embodiment of the filter, wherein a PMOS source follower is employed for the voltage buffer.

FIG. 4A illustrates an exemplary embodiment 400A of the filter 400, wherein a PMOS source follower 410A is employed for the voltage buffer 410. One of ordinary skill in the art will appreciate that the voltage buffer 410A is shown for illustrative purposes only, and that other implementations of a voltage buffer may be readily utilized. One of ordinary skill in the art will further appreciate that in exemplary embodiments of a filter employing NMOS transistors, an NMOS source follower may instead be employed for the voltage buffer. Such alternative exemplary embodiments are contemplated to be within the scope of the present disclosure.

Figure 5:
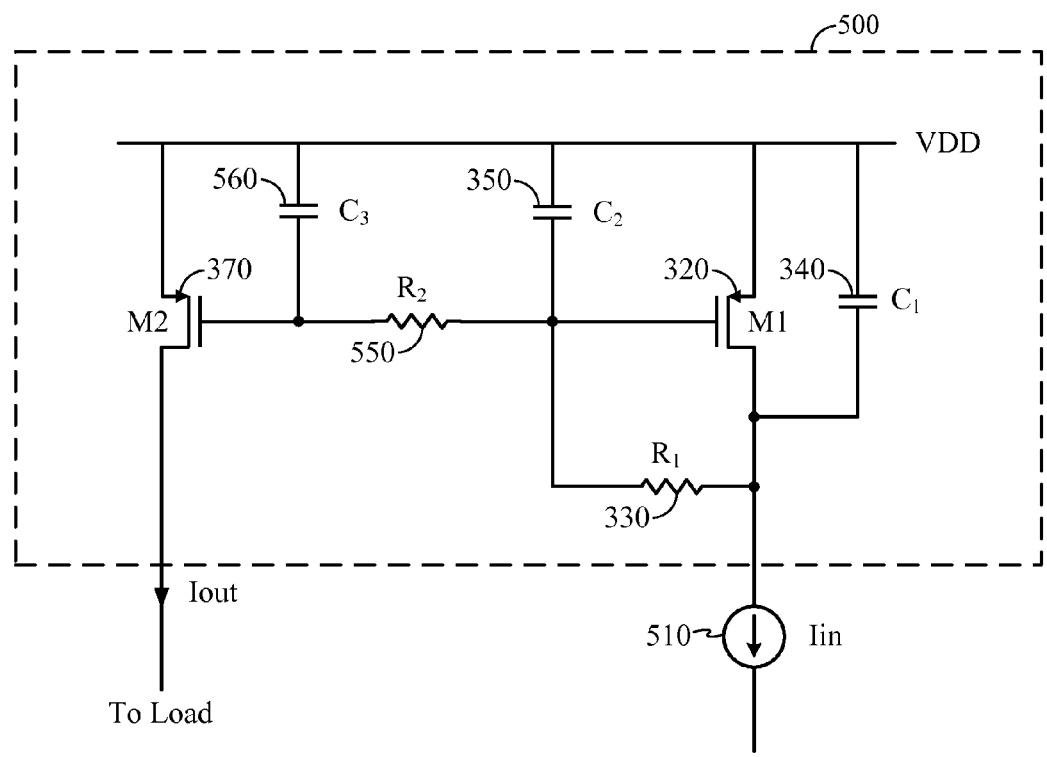
FIG. 5 illustrates an exemplary embodiment of a third-order low-pass filter according to the present disclosure.

FIG. 5 illustrates an exemplary embodiment 500 of a third-order low-pass filter 500 according to the present disclosure. In FIG. 5, a resistor 550 (or $R_2$) is provided between the gates of M1 and M2, and a capacitor 560 (or $C_3$) is further provided to couple the gate of M2 to the source voltage VDD. It will be appreciated that the transfer characteristic of the filter 500 may be expressed as follows:

$$H(s) = \frac{I_{out}}{I_{in}} = \frac{g_{m2}}{\tau_3 s^3 + \tau_2 s^2 + \tau_1 s + g_{m1}};$$ (Eq. 7a)

$$\tau_3 = R_1 R_2 C_1 C_2 C_3;$$ (Eq. 7b)

$$\tau_2 = R_2 C_2 C_3 + R_2 C_1 C_3 + R_1 C_1 C_2 + R_1 C_1 C_3; \text{ and}$$ (Eq. 7c)

$$\tau_1 = C_1 + C_2 + C_3 + C_3 R_2 g_{m1}.$$ (Eq. 7d)

Figure 5A:
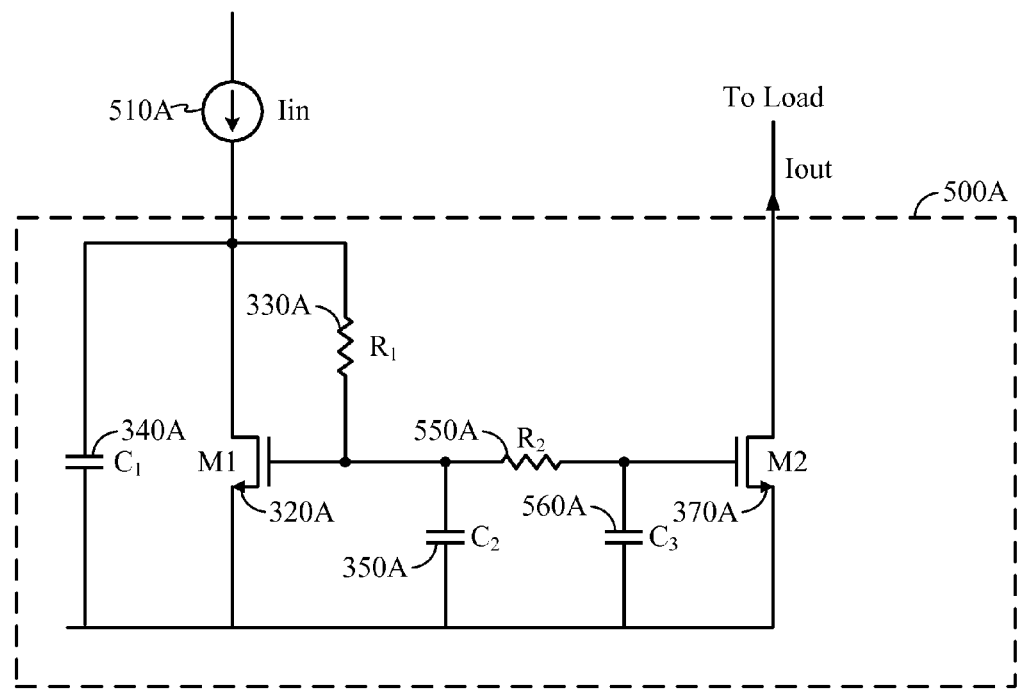
FIG. 5A illustrates an alternative exemplary embodiment of a third-order low-pass filter according to the present disclosure.

FIG. 5A illustrates an alternative exemplary embodiment 500A of a third-order low-pass filter according to the present disclosure. It will be appreciated that the filter 500A may be identical in structure to the filter 500 shown in FIG. 5A, with NMOS transistors 320A and 370A used in place of PMOS transistors 320 and 370 in FIG. 5, and corresponding connections made to a ground voltage rather than a positive supply voltage VDD as shown in FIG. 5.

It will be appreciated that the filters 500 and 500A have third-order low-pass filter transfer characteristics, and that the transfer characteristic of the filters may be designed by appropriate choice of the circuit parameters in Eqs. 7.

Figure 6:
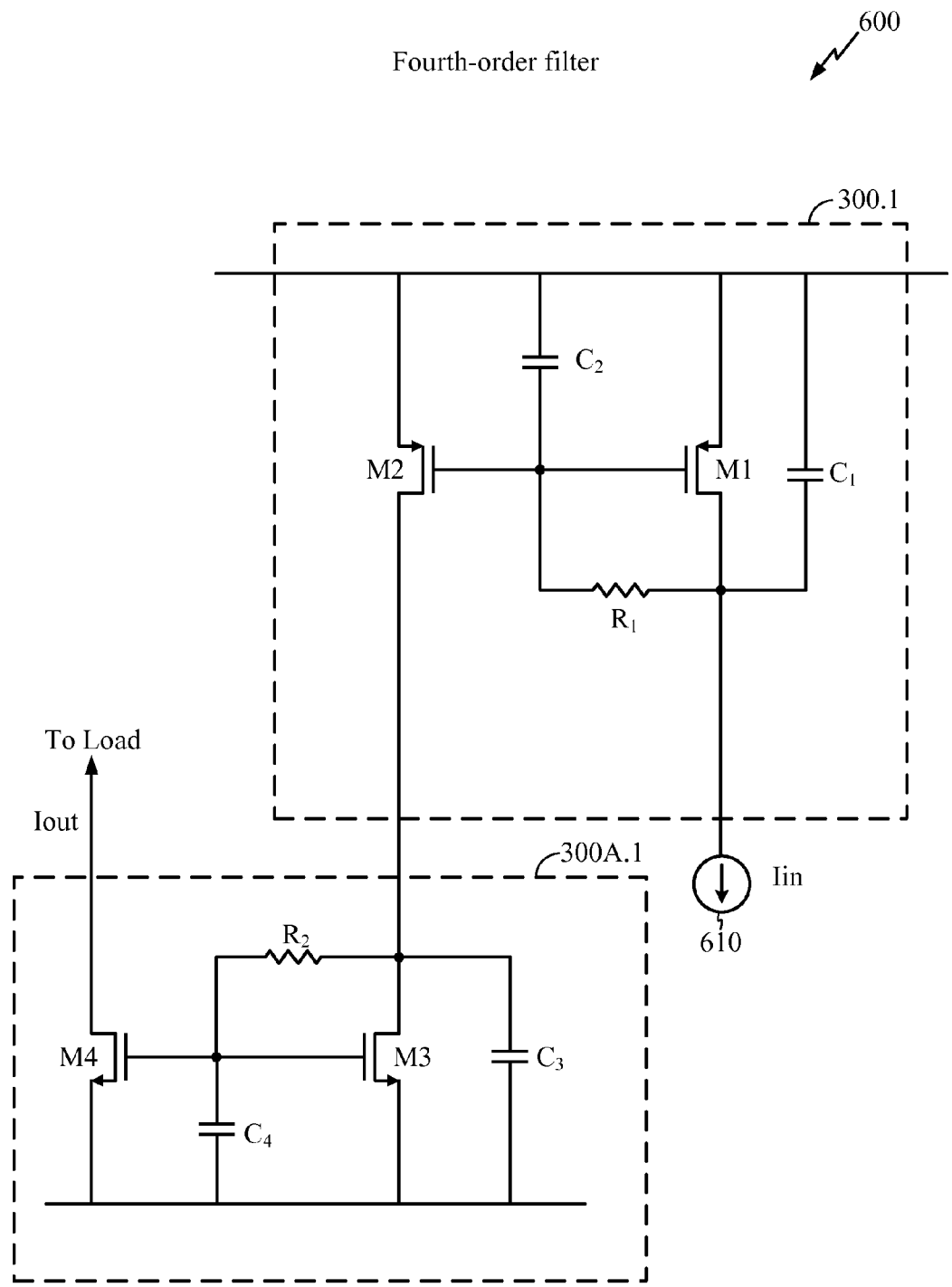
FIG. 6 illustrates an exemplary embodiment of a technique for synthesizing an even-order filter, e.g., a fourth-order filter, by cascading filters according to the present disclosure.

FIG. 6 illustrates an exemplary embodiment 600 of a technique for synthesizing an even-order filter, e.g. a fourth-order filter, by cascading filters according to the present disclosure. In FIG. 6, an input current 610 is coupled to an instance 300.1 of the second-order filter 300, which is further coupled to an instance 300A.1 of the second-order filter 300A. It will be appreciated that the filters 300.1 and 300A.1 are complementary, i.e., the filter 300.1 is implemented with PMOS transistors M1 and M2, while the filter 300A.1 is implemented with NMOS transistors M3 and M4, and the output current of the filter 300.1 is utilized as the input current of the filter 300A.1. The output of the filter 300A.1 may be provided as the output current to a load (not shown).

Figure 6A:
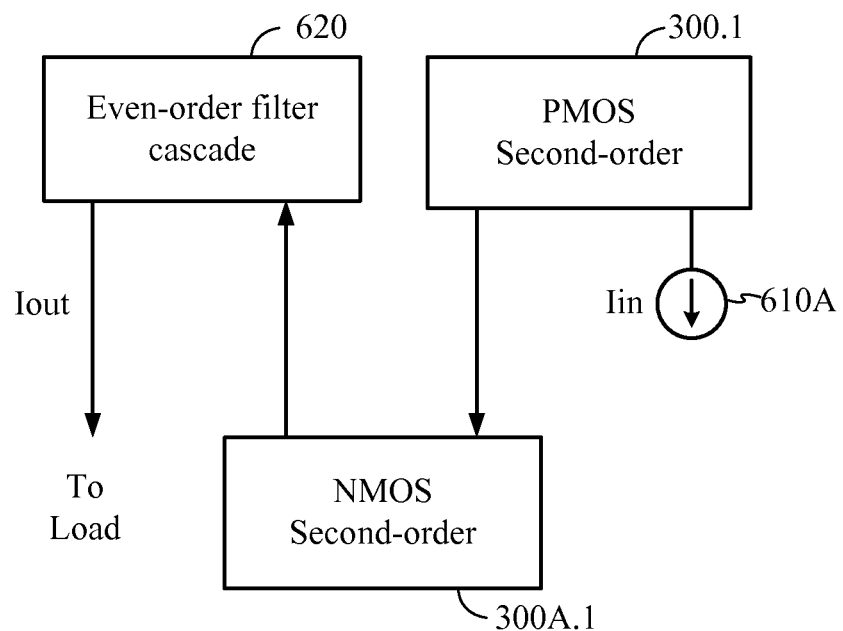
FIG. 6A illustrates an exemplary embodiment of a filter having arbitrary even-order low-pass transfer characteristics according to the present disclosure, wherein the output current of a filter may be further coupled to a filter cascade.

FIG. 6A illustrates an exemplary embodiment 600A of a filter having arbitrary even-order low-pass transfer characteristics according to the present disclosure, wherein the output current of the filter 300A.1 may be further coupled to an even-order filter cascade 620. In an exemplary embodiment, the filter cascade 620 may itself include one or more instances of cascaded second-order filters 300 and 300A, such that a low-pass transfer characteristic having arbitrary even order may be synthesized for the transfer characteristic Iout(s)/Iin(s).

Figure 7:
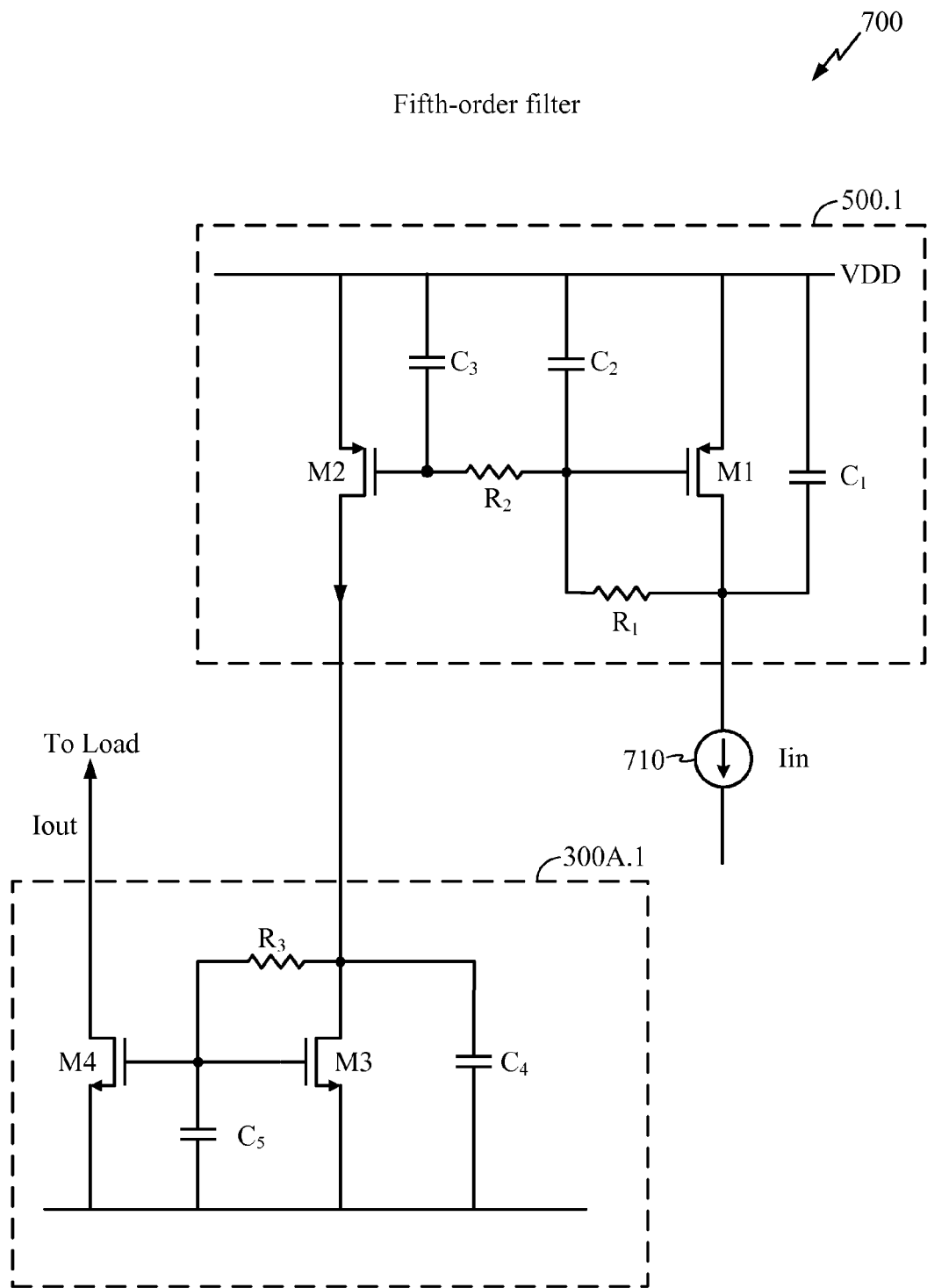
FIG. 7 illustrates an exemplary embodiment of a technique for synthesizing an odd-order filter, e.g., a fifth-order filter, by cascading filters according to the present disclosure.

FIG. 7 illustrates an exemplary embodiment 700 of a technique for synthesizing an odd-order filter, e.g. a fifth-order filter, by cascading filters according to the present disclosure. In FIG. 7, an input current 710 (or Iin) is coupled to an instance 500.1 of the third-order filter 500, which is further coupled to an instance 300A.1 of the second-order filter 300A. It will be appreciated that the filters 500.1 and 300A.1 are complementary, i.e., the filter 500.1 is implemented with PMOS transistors M1 and M2, while the filter 300A.1 is implemented with NMOS transistors M3 and M4, such that the output current of the filter 500.1 may be used as the input current of the filter 300A.1. The output current of the filter 300A.1 may be provided as the output current to a load (not shown).

Figure 7A:
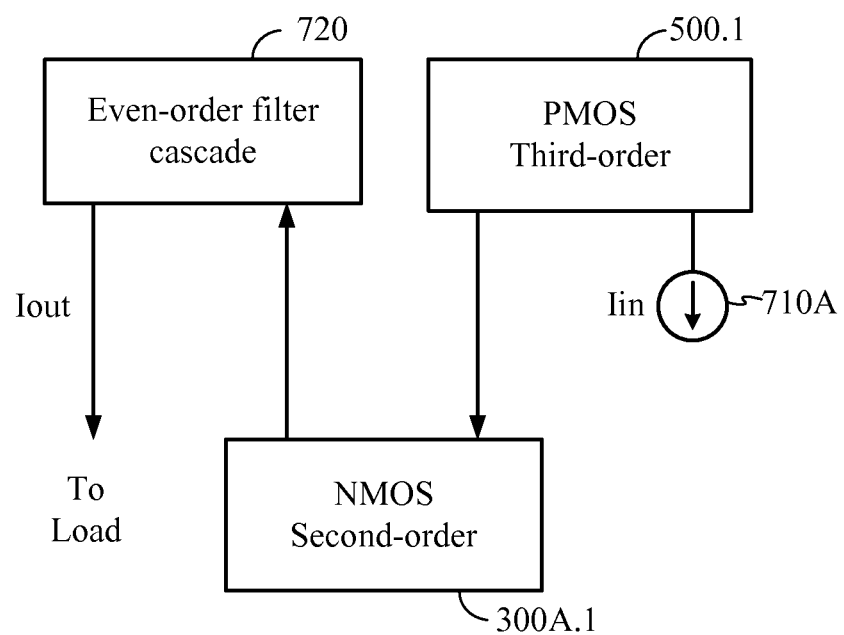
FIG. 7A illustrates an alternative exemplary embodiment of a filter having arbitrary odd-order low-pass transfer characteristics according to the present disclosure, wherein the output current of a filter may be further coupled to an even-order filter cascade.

FIG. 7A illustrates an alternative exemplary embodiment 700A of a filter having arbitrary odd-order low-pass transfer characteristics according to the present disclosure, wherein the output current of the filter 300A.1 may be further coupled to an even-order filter cascade 720. In an exemplary embodiment, the filter cascade 720 may itself include one or more instances of second-order filters 300 and 300A, such that a low-pass transfer characteristic having arbitrary odd order may be synthesized for the transfer characteristic Iout(s)/Iin(s).

Figure 7B:
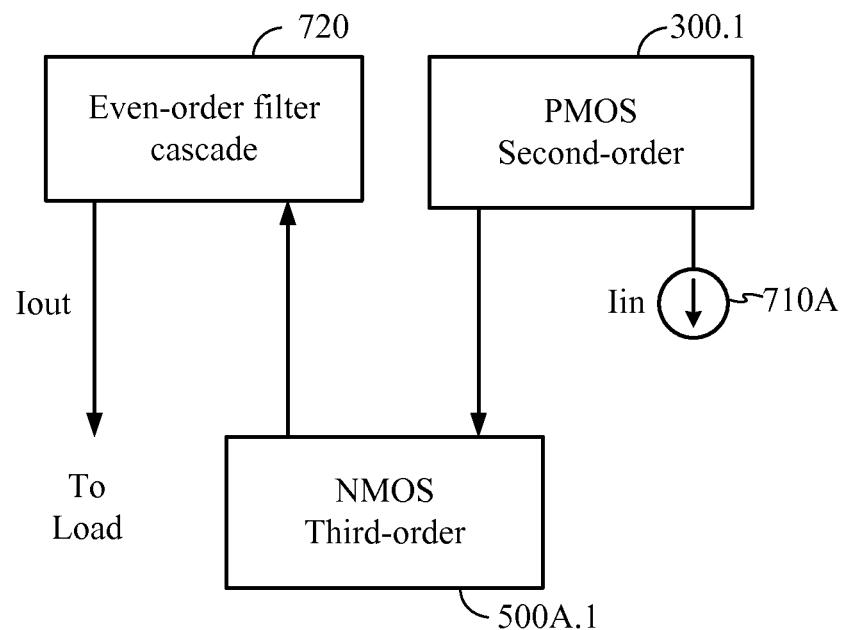
FIG. 7B illustrates an exemplary embodiment of a filter wherein an instance of a second-order filter having PMOS transistors is coupled to an instance of a third-order filter having NMOS transistors, wherein the output current of a filter is further coupled to an even-order filter cascade.

One of ordinary skill in the art will appreciate in light of the techniques disclosed herein that the filters 300, 300A, 500, and 500A may generally be concatenated in arbitrary sequences other than those explicitly shown to synthesize a filter having arbitrary low-pass transfer characteristics. For example, FIG. 7B illustrates an exemplary embodiment of a filter wherein an instance 300.1 of a second-order filter 300 having PMOS transistors is coupled to an instance 500A.1 of a third-order filter 500A having NMOS transistors, wherein the output current of a filter is further coupled to an even-order filter cascade 720. Such alternative exemplary embodiments are contemplated to be within the scope of the present disclosure.

While exemplary embodiments of cascaded filters have been described that employ filters designed according to the techniques of the present disclosure, it will be appreciated that any cascaded filter may employ one or more prior art current-mode filters as one of the filters in the cascade. For example, in the even-order filter cascade 620 or 720, a prior art current-mode filter such as 200 or 200A may be cascaded with one or more odd- or even-order filters according to the present disclosure, and such alternative exemplary embodiments are contemplated to be within the scope of the present disclosure.

Figure 8:
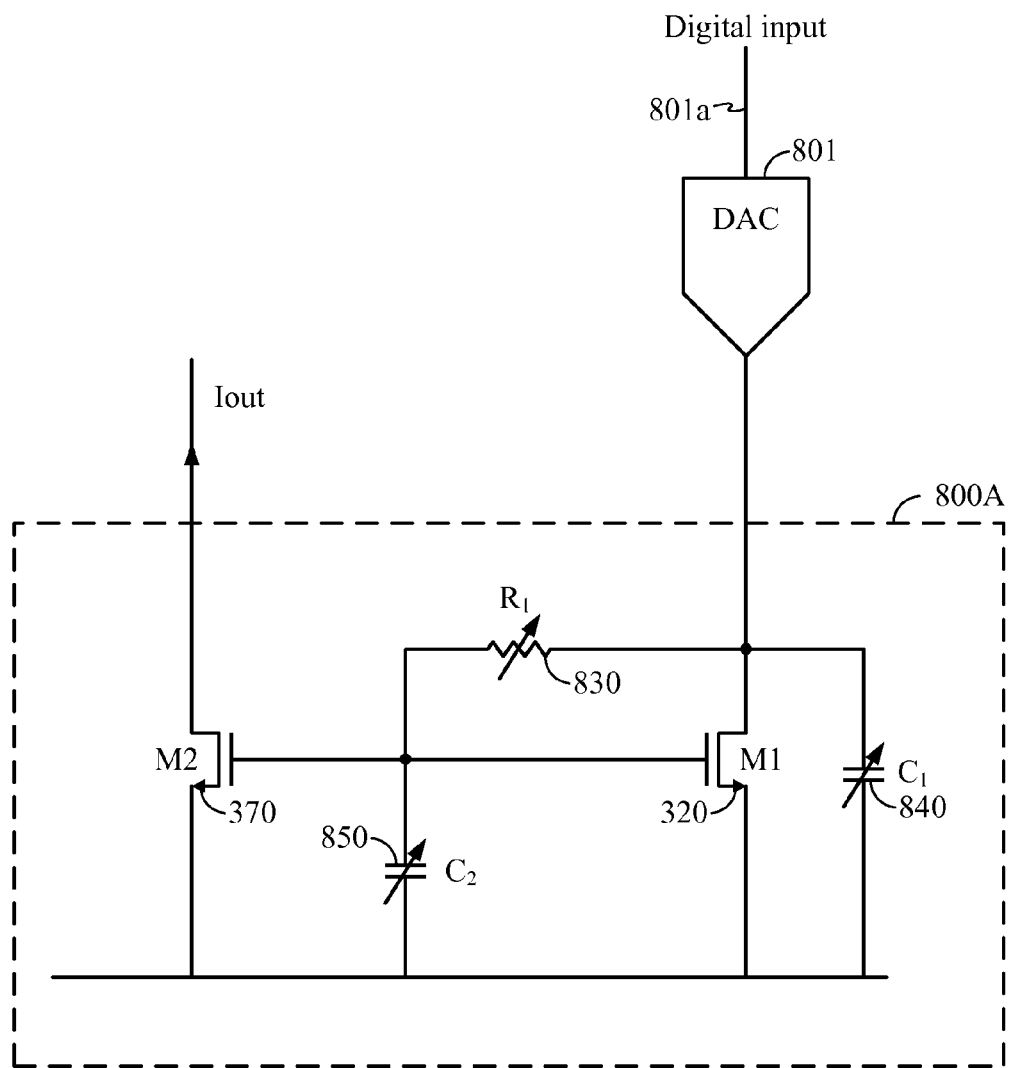
FIG. 8 illustrates an exemplary embodiment of a filter for filtering the output current of a DAC.

FIG. 8 illustrates an exemplary embodiment of a filter 800A for filtering the output current of a DAC 801. The DAC 801 is provided with a digital input signal 801a for controlling, e.g., the amplitude of the output current of the DAC 801. The filter 800A includes an adjustable resistor 830 (or $R_1$), and adjustable capacitors 840 (or $C_1$) and 850 (or $C_2$). In an exemplary embodiment, the adjustable resistors and capacitors may be dynamically adjusted, e.g., during operation of the filter 800A, to adjust the frequency response of the filter 800A. Various techniques are known in the art for providing elements with variable resistance or capacitance, e.g., MOS resistors or varactors, and such exemplary embodiments are contemplated to be within the scope of the present disclosure.

Figure 9:
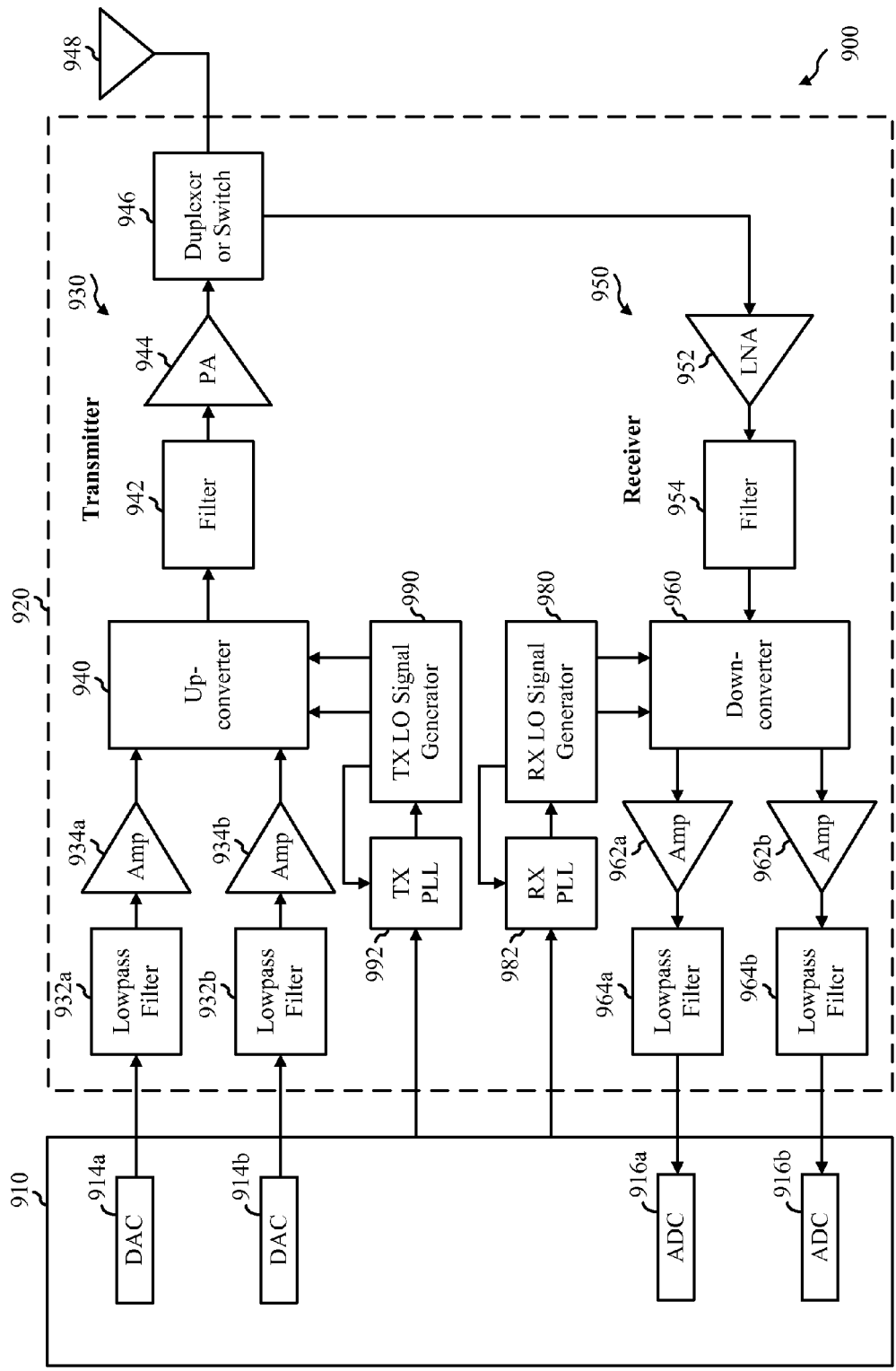
FIG. 9 illustrates a block diagram of a design of a wireless communication device in which the techniques of the present disclosure may be implemented.

FIG. 9 illustrates a block diagram of a design of a wireless communication device 900 in which the techniques of the present disclosure may be implemented. FIG. 9 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 9. Furthermore, other circuit blocks not shown in FIG. 9 may also be used to condition the signals in the transmitter and receiver. Some circuit blocks in FIG. 9 may also be omitted.

In the design shown in FIG. 9, wireless device 900 includes a transceiver 920 and a data processor 910. The data processor 910 may include a memory (not shown) to store data and program codes. Transceiver 920 includes a transmitter 930 and a receiver 950 that support bi-directional communication. In general, wireless device 900 may include any number of transmitters and any number of receivers for any number of communication systems and frequency bands. All or a portion of transceiver 920 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 9, transmitter 930 and receiver 950 are implemented with the direct-conversion architecture.

In the transmit path, data processor 910 processes data to be transmitted and provides I and Q analog output signals to transmitter 930. In the exemplary embodiment shown, the data processor 910 includes digital-to-analog-converters (DAC's) 914a and 914b for converting digital signals generated by the data processor 910 into the I and Q analog output signals, e.g., I and Q output currents, for further processing.

Within transmitter 930, lowpass filters 932a and 932b filter the I and Q analog output signals, respectively, to remove undesired images caused by the prior digital-to-analog conversion. In an exemplary embodiment, the lowpass filters 932a and 932b may be designed as current-mode filters according to the principles of the present disclosure. Amplifiers (Amp) 934a and 934b amplify the signals from lowpass filters 932a and 932b, respectively, and provide I and Q baseband signals. An upconverter 940 upconverts the I and Q baseband signals with I and Q transmit (TX) local oscillating (LO) signals from a TX LO signal generator 990 and provides an upconverted signal. A filter 942 filters the upconverted signal to remove undesired images caused by the frequency upconversion as well as noise in a receive frequency band. A power amplifier (PA) 944 amplifies the signal from filter 942 to obtain the desired output power level and provides a transmit RF signal. The transmit RF signal is routed through a duplexer or switch 946 and transmitted via an antenna 948.

In the receive path, antenna 948 receives signals transmitted by base stations and provides a received RF signal, which is routed through duplexer or switch 946 and provided to a low noise amplifier (LNA) 952. The received RF signal is amplified by LNA 952 and filtered by a filter 954 to obtain a desirable RF input signal. A downconverter 960 downconverts the RF input signal with I and Q receive (RX) LO signals from an RX LO signal generator 980 and provides I and Q baseband signals. The I and Q baseband signals are amplified by amplifiers 962a and 962b and further filtered by lowpass filters 964a and 964b to obtain I and Q analog input signals, which are provided to data processor 910. In the exemplary embodiment shown, the data processor 910 includes analog-to-digital-converters (ADC's) 916a and 916b for converting the analog input signals into digital signals to be further processed by the data processor 910.

TX LO signal generator 990 generates the I and Q TX LO signals used for frequency upconversion. RX LO signal generator 980 generates the I and Q RX LO signals used for frequency downconversion. Each LO signal is a periodic signal with a particular fundamental frequency. A PLL 992 receives timing information from data processor 910 and generates a control signal used to adjust the frequency and/or phase of the TX LO signals from LO signal generator 990. Similarly, a PLL 982 receives timing information from data processor 910 and generates a control signal used to adjust the frequency and/or phase of the RX LO signals from LO signal generator 980.

Figure 10:
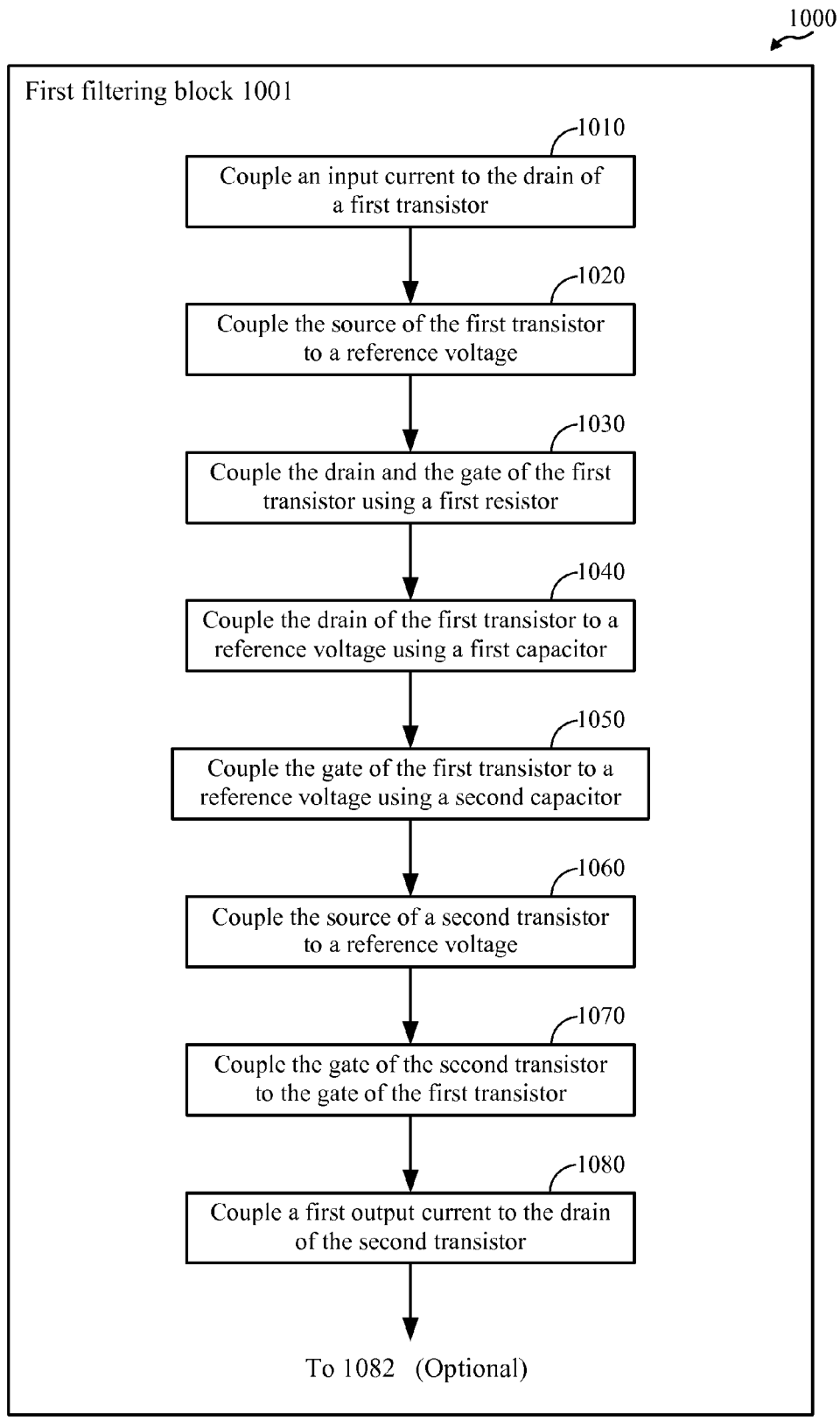
FIGS. 10 and 10A illustrate an exemplary embodiment of a method for low-pass filtering according to the present disclosure.
Figure 10A:
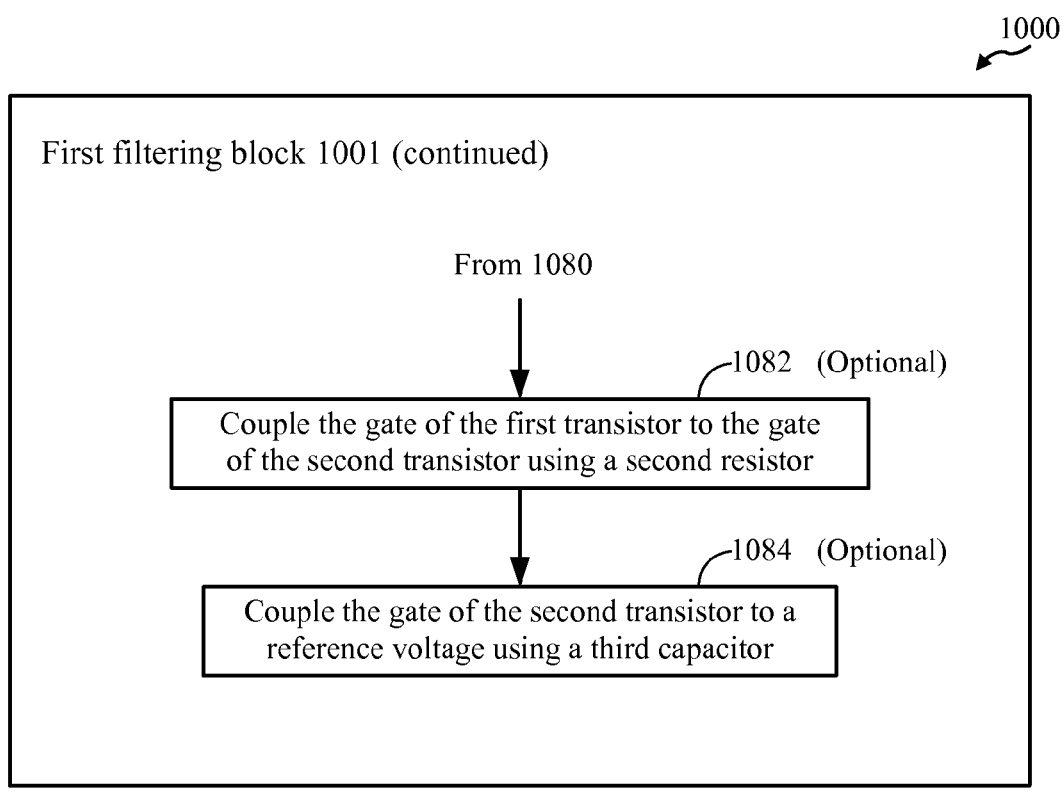

FIGS. 10 and 10A illustrate an exemplary embodiment of a method 1000 for low-pass filtering according to the present disclosure. Note the method 1000 is shown for illustrative purposes only, and is not meant to limit the scope of the present disclosure in any way.

In FIG. 10, a first filtering block 1001 includes blocks 1010-1080 for low-pass filtering.

At block 1010, an input current is coupled to the drain of a first transistor.

At block 1020, the source of the first transistor is coupled to a reference voltage.

At block 1030, the drain and the gate of the first transistor are coupled using a first resistor.

At block 1040, the drain of the first transistor is coupled to a reference voltage using a first capacitor.

At block 1050, the gate of the first transistor is coupled to a reference voltage using a second capacitor.

At block 1060, the source of a second transistor is coupled to a reference voltage.

At block 1070, the gate of the second transistor is coupled to the gate of the first transistor.

At block 1080, a first output current is coupled to the drain of the second transistor.

At optional block 1082, the gate of the first transistor is coupled to the gate of the second transistor using a second resistor.

At optional block 1084, the gate of the second transistor is coupled to a reference voltage using a third capacitor.

It will be appreciated in light of the present disclosure that blocks 1010 through 1080 allow the first filtering block 1001 to perform second-order filtering, while the addition of optional blocks 1082 and 1084 allows the first filtering block 1001 to perform third-order filtering.

Figure 11:
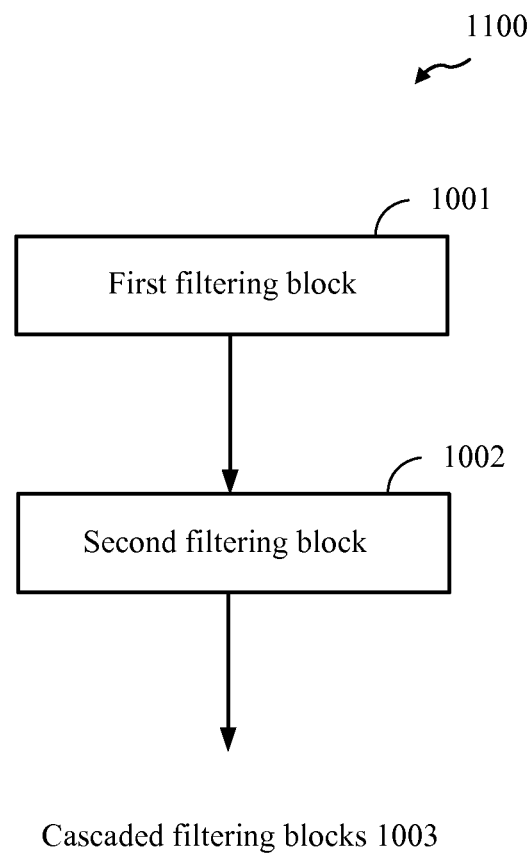
FIG. 11 illustrates an alternative exemplary embodiment of a method for low-pass filtering according to the present disclosure.

FIG. 11 illustrates an alternative exemplary embodiment of a method 1100 for low-pass filtering according to the present disclosure. In FIG. 11, the method 1100 includes a first filtering block 1001, followed by a second filtering block 1002, followed by a cascaded filtering block 1003. In an exemplary embodiment, the first filtering block 1001 is implemented as described herein with reference to FIGS. 10 and 10A. In an exemplary embodiment, the second filtering block 1002 may also be implemented as described herein with reference to the first filtering block 1001 in FIGS. 10 and 10A. In an exemplary embodiment, the cascaded filtering block 1003 may include multiple cascaded filter blocks, each implemented as described with reference to the first filtering block 1001 in FIGS. 10 and 10A. It will be appreciated that the blocks illustrated in FIG. 11 may correspond to the cascading of multiple filters to achieve low-pass filters of arbitrary even or odd order, as earlier described herein. It will further be appreciated that the first filtering block 1001 may alternatively function as a stand-alone filtering block in the absence of subsequent cascaded filtering blocks such as second filtering block 1002 and cascaded filtering block 1003 to perform either even- or odd-order filtering, and such alternative exemplary embodiments are contemplated to be within the scope of the present disclosure.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
a first transistor comprising a drain, a gate, and a source, the source coupled to a positive supply voltage;
a first resistor coupling the drain and the gate of the first transistor;
a first capacitor coupling the drain of the first transistor to the positive supply voltage;
a second capacitor coupling the gate of the first transistor to the positive supply voltage; and
a second transistor comprising a drain, a gate, and a source, the source coupled to the positive supply voltage, the gate coupled to the gate of the first transistor; and
a voltage buffer coupling the drain of the first transistor to the first resistor.

2. The apparatus of claim 1, the first and second transistors being PMOS transistors.

3. The apparatus of claim 1, the first and second transistors being NMOS transistors.

4. The apparatus of claim 1, the voltage buffer comprising a source follower.

5. The apparatus of claim 1, further comprising:
a second resistor coupling the gate of the first transistor to the gate of the second transistor;

a third capacitor coupling the gate of the second transistor to a reference voltage.

6. The apparatus of claim 1, further comprising a digital-to-analog converter (DAC) for generating an input current coupled to the drain of the first transistor.

7. The apparatus of claim 1, further comprising at least one baseband TX amplifier coupled to the drain of the second transistor, a TX LO signal generator, an upconverter coupled to the TX LO signal generator and the at least one baseband TX amplifier, a TX filter coupled to the output of the upconverter, a power amplifier (PA) coupled to the TX filter, a duplexer coupled to the output of the power amplifier, a low-noise amplifier (LNA) coupled to the duplexer, a filter coupled to the LNA, an RX LO signal generator, a downconverter coupled to the RX LO signal generator and the filter coupled to the LNA, and at least one RX low-pass filter coupled to the output of the downconverter.

8. An apparatus comprising:
a first transistor comprising a drain, a gate, and a source, the source coupled to a reference voltage;
a first resistor coupling the drain and the gate of the first transistor;
a first capacitor coupling the drain of the first transistor to a reference voltage;
a second capacitor coupling the gate of the first transistor to a reference voltage; and
a second transistor comprising a drain, a gate, and a source, the source coupled to a reference voltage, the gate of the second transistor coupled to the gate of the first transistor;
wherein the first transistor, first resistor, first capacitor, second capacitor, and second transistor form a first filter, the apparatus further comprising a second filter comprising:
a first transistor comprising a drain, a gate, and a source, the source coupled to a second reference voltage, the drain of the second transistor of the first filter being coupled to the drain of the first transistor, the first transistor being complementary to the first transistor of the first filter;
a first resistor coupling the drain and the gate of the first transistor;
a first capacitor coupling the drain of the first transistor to the second reference voltage;
a second capacitor coupling the gate of the first transistor to the second reference voltage; and
a second transistor comprising a drain, a gate, and a source, the source coupled to the second reference voltage, the gate coupled to the gate of the first transistor.

9. The apparatus of claim 8, further comprising at least one additional filter cascaded in series with the first and second filters.

10. An apparatus comprising:
a first transistor comprising a drain, a gate, and a source, the source coupled to a reference voltage;
a first resistor coupling the drain and the gate of the first transistor;
a first capacitor coupling the drain of the first transistor to a reference voltage;
a second capacitor coupling the gate of the first transistor to a reference voltage;
a second transistor comprising a drain, a gate, and a source, the source coupled to a reference voltage, the gate of the second transistor coupled to the gate of the first transistor;
a second resistor coupling the gate of the first transistor to the gate of the second transistor; and
a third capacitor coupling the gate of the second transistor to a reference voltage;
the first transistor, first resistor, first capacitor, second capacitor, and second transistor forming a first filter, the apparatus further comprising a second filter comprising:
a first transistor comprising a drain, a gate, and a source, the source coupled to a second reference voltage, the drain of the second transistor of the first filter being coupled to the drain of the first transistor, the first transistor being complementary to the first transistor of the first filter;
a first resistor coupling the drain and the gate of the first transistor; a first capacitor coupling the drain of the first transistor to a second reference voltage;
a second capacitor coupling the gate of the first transistor to a second reference voltage; and
a second transistor comprising a drain, a gate, and a source, the source coupled to a second reference voltage, the gate coupled to the gate of the first transistor.

11. A method comprising:
coupling an input current to the drain of a first transistor;
coupling the source of the first transistor to a positive supply voltage;
coupling the drain and the gate of the first transistor using a first resistor;
coupling the drain of the first transistor to the positive supply voltage using a first capacitor;
coupling the gate of the first transistor to the positive supply voltage using a second capacitor;
coupling the source of a second transistor to the positive supply voltage;
coupling the gate of the second transistor to the gate of the first transistor;
coupling a first output current to the drain of the second transistor; and
coupling a voltage buffer between the drain of the first transistor and the first resistor.

12. The method of claim 11, the first and second transistors being PMOS transistors.

13. The method of claim 11, the first and second transistors being NMOS transistors.

14. The method of claim 11, the voltage buffer comprising a source follower.

15. The method of claim 11, further comprising:
coupling the gate of the first transistor to the gate of the second transistor using a second resistor; and
coupling the gate of the second transistor to a reference voltage using a third capacitor.

16. A method comprising:
coupling an input current to the drain of a first transistor;
coupling the source of the first transistor to a reference voltage;
coupling the drain and the gate of the first transistor using a first resistor;
coupling the drain of the first transistor to a reference voltage using a first capacitor;
coupling the gate of the first transistor to a reference voltage using a second capacitor;
coupling the source of a second transistor to a reference voltage;
coupling the gate of the second transistor to the gate of the first transistor; and coupling a first output current to the drain of the second transistor;
further comprising coupling the first output current to a second filtering block, the coupling the first output current to the second filtering block comprising:
coupling the first output current to the drain of a third transistor complementary to the first transistor;

coupling the source of the third transistor to a second reference voltage;

coupling the drain and the gate of the third transistor using a first resistor of the second filtering block;

coupling the drain of the third transistor to a second reference voltage using a first capacitor of the second filtering block;

coupling the gate of the third transistor to a second reference voltage using a second capacitor of the second filtering block;

coupling the source of a fourth transistor to a second reference voltage;

coupling the gate of the fourth transistor to the gate of the third transistor; and coupling a second output current to the drain of the fourth transistor.

17. The method of claim 16, further comprising cascading at least one additional filtering block in series with the second output current.

18. A method comprising:

coupling an input current to the drain of a first transistor;

coupling the source of the first transistor to a reference voltage;

coupling the drain and the gate of the first transistor using a first resistor;

coupling the drain of the first transistor to a reference voltage using a first capacitor;

coupling the gate of the first transistor to a reference voltage using a second capacitor;

coupling the source of a second transistor to a reference voltage;

coupling the gate of the second transistor to the gate of the first transistor; and coupling a first output current to the drain of the second transistor;

coupling the gate of the first transistor to the gate of the second transistor using a second resistor; and coupling the gate of the second transistor to a reference voltage using a third capacitor;

the method further comprising coupling the first output current to a second filtering block, the coupling the first output current to the second filtering block comprising:

coupling the first output current to the drain of a third transistor complementary to the first transistor;

coupling the source of the third transistor to a second reference voltage;

coupling the drain and the gate of the third transistor using a first resistor of the second filtering block;

coupling the drain of the third transistor to a second reference voltage using a first capacitor of the second filtering block;

coupling the gate of the third transistor to a second reference voltage using a second capacitor of the second filtering block;

coupling the source of a fourth transistor to a second reference voltage;

coupling the gate of the fourth transistor to the gate of the third transistor; and coupling a second output current to the drain of the fourth transistor.

19. The method of claim 11, further comprising:

converting a digital signal to an analog current; and coupling the analog current to the input current.

20. An apparatus comprising a low-pass filter, the filter comprising:

means for filtering an input current with a second-order low-pass transfer characteristic to generate an intermediate current, the means for filtering the input current comprising a capacitor coupling the gate of a first transistor to a positive supply voltage; and means for further filtering the intermediate current with an even-order low-pass transfer characteristic to generate an output current.

21. An apparatus comprising a low-pass filter, the filter comprising:

means for filtering an input current with a third-order low-pass transfer characteristic to generate an intermediate current, the means for filtering the input current comprising a capacitor coupling the gate of a first transistor to a positive supply voltage; and means for filtering the intermediate current with an even-order low-pass transfer characteristic to generate an output current.

* * * * *